(12) United States Patent
Oda

(10) Patent No.: US 6,798,284 B2
(45) Date of Patent: Sep. 28, 2004

(54) VARIABLE-IMPEDANCE REFERENCE CIRCUIT AND VARYING METHOD

(75) Inventor: Yasuo Oda, Saitama (JP)

(73) Assignee: Wacom Co., Ltd., Saitama-ken (JP)

(*) Notice: Subject to any disclaimer, the term of this patent is extended or adjusted under 35 U.S.C. 154(b) by 0 days.

(21) Appl. No.: 10/339,556

(22) Filed: Jan. 10, 2003

(65) Prior Publication Data

US 2003/0155969 A1 Aug. 21, 2003

(51) Int. Cl.[7] ................................................ H03F 1/36
(52) U.S. Cl. .......................... 330/86; 330/282; 330/284
(58) Field of Search ......................... 330/86, 282, 284; 455/6.1, 83; 327/518

(56) References Cited

U.S. PATENT DOCUMENTS 6,198,349 B1 * 3/2001 Kanno et al. ............... 330/282

FOREIGN PATENT DOCUMENTS

JP            403232310     * 10/1991

OTHER PUBLICATIONS

Platzker et al. "Extremely low Power Transmitter/receiver GaAs MMIC circuits at L Band" IEEE 1992 Microwave and Millimeter–Wave Monolithic Circuits Symposium Jan. 1–3, 1992, pp 97–100.*

* cited by examiner

*Primary Examiner*—Michael B Shingleton
(74) *Attorney, Agent, or Firm*—Liniak, Berenato & White, LLC

(57) ABSTRACT

A reference circuit having a variable-impedance function for reducing current consumption is provided. By switching an output impedance of the reference circuit so that the output impedance is large when transmitting a high-frequency signal to a sensor coil, and the output impedance is small when receiving a response signal from the sensor coil, current consumption is reduced. The reference circuit includes a loop gain adjusting circuit having a switch for switching a gain. The magnitude of the output impedance of the reference circuit is switched by opening and closing the switch to switch the gain.

12 Claims, 3 Drawing Sheets

DIFFERENTIAL APPLIFYING STAGE | VOLTAGE AMPLIFYING STAGE | CURRENT AMPLIFYING STAGE

VARIABLE-IMPEDANCE REFERENCE CIRCUIT AND VARYING METHOD

CLAIM TO PRIORITY

Applicant hereby claims priority under 35 U.S.C. §119 to Japanese Application No. 2002-002964, filed Jan. 11, 2002, the disclosure of which is incorporated herein by reference.

1. Field of the Invention

The present invention relates to an analogous IC for use in a digitizer, which is an input device of a computer, and in particular relates to a reference circuit having a variable-impedance function for reducing power consumption.

2. Background of the Invention

A conventional digitizer includes a reference circuit. Various analogous IC reference circuits for digitizers are known in the art. In an analogous IC for a digitizer driven by a single power supply, a common (COM) end of a sensor coil is raised to 0.5 voltage at the common collector (Vcc) using the reference circuit to deliver an alternating current during transmission. The reference circuit for raising the COM end to 0.5 Vcc has low output impedance for increasing the resistance against noise when a response signal receiver receives a signal from the sensor coil.

A high-frequency signal transmitter transmits a high-frequency signal to the sensor coil. The circuit includes a bypass capacitor, which receives a high-frequency current delivered from a driver circuit of the high-frequency signal transmitter. Since the output impedance of the reference circuit is relatively small, a current flows into the reference circuit from the sensor coil, thereby increasing current consumption.

In a conventional system, in order to reduce noise produced when the receiver receives a signal from the sensor coil, the reference coil is designed to have low output impedance. When the high-frequency signal transmitter transmits a signal to the sensor coil, the reference circuit absorbs as far as the electric charge stored in the bypass capacitor, thereby wasting the transmitting current.

SUMMARY OF THE INVENTION

A variable-impedance reference circuit switches output impedance of a reference circuit between the transmitting operation and the receiving operation of a high-frequency signal. During the transmitting operation, the output impedance of the reference circuit is switched to high impedance so as not to absorb the current delivered from a driver of a high-frequency signal transmitter. During the receiving operation, the output impedance of the reference circuit is switched to low impedance so as not to reduce the resistance against noise.

A variable-impedance reference circuit according to the present invention comprises a reference circuit for supplying a reference electric potential to a sensor coil, wherein the variable-impedance reference circuit switches an output impedance of the reference circuit so that the output impedance is large when transmitting a high-frequency signal to the sensor coil, and the output impedance is small when receiving a response signal from the sensor coil, thereby reducing current consumption. Preferably, the reference circuit comprises a loop gain adjusting circuit having a switch for switching a gain, so that the magnitude of the output impedance of the reference circuit is switched by opening and closing the switch to switch the gain.

The output impedance of the reference circuit according to the present invention is switchable. Therefore, when a signal from a sensor coil is received, the output impedance of the reference circuit is decreased to reduce noise. When a signal is transmitted to the sensor coil, the output impedance of the reference circuit is increased to prevent the charge of a bypath capacitor from being absorbed. Thus, when receiving a signal from the sensor coil, noise is reduced; when transmitting a signal to the sensor coil, current loss is reduced.

DETAILED DESCRIPTION OF THE INVENTION

Figure 1:
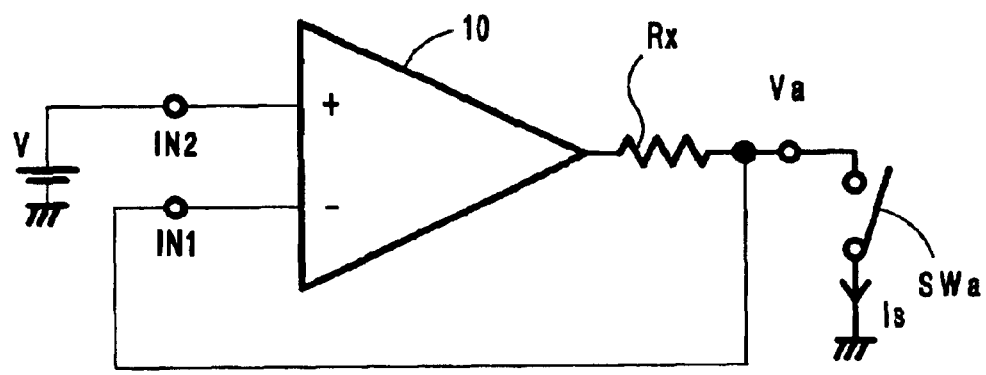
FIG. 1 is a circuit diagram illustrating the relationship between a gain and output impedance.

Before describing a variable-impedance reference circuit according to the present invention, the relationship between a gain and output impedance will be explained. The output impedance of the reference circuit changes by changes in a loop gain of the reference circuit. If the loop gain is increased, the impedance is reduced, and vice versa. The relationship between a gain and an output impedance is best shown in FIG. 1. A circuit 10 comprises an N-channel metal-oxide semiconductor (MOS) field-effect transistor, and a P-channel MOS field-effect transistor, having an output impedance Zo and a gain A. If a monoploid voltage-follower type reference circuit is provided, wherein the output is connected to an output terminal 1N1, the output impedance is obtained using Shao-Thevenin's theorem. If a voltage V is input in an input terminal 1N2, an output-terminal releasing voltage Vo and a GND short-circuited current Is, which is when a Swo at the output terminal is closed, are as follows:

$$Vo = V \cdot A/(A+1)$$

$$Is = V \cdot A/Ro.$$

Then, the output impedance Zo is obtained from the following equation;

$$Zo = Vo/Is = Ro/(A+1).$$

Therefore, the output impedance Zo and the gain A are in substantially inverse proportion to each other.

Figure 2:
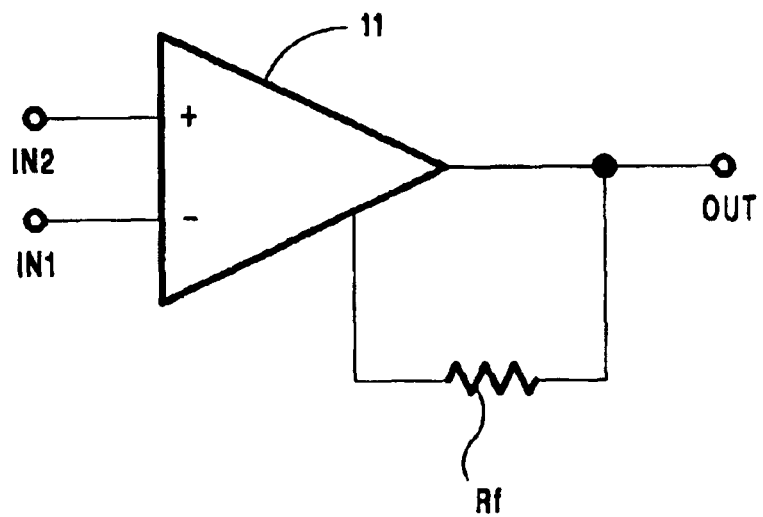
FIG. 2 is a circuit diagram illustrating the relationship between the output impedance and a feedback resistance in the circuit shown in FIG. 1.

The relationship between an output impedance in the circuit 10 and a feedback resistor of FIG. 1 are best shown in FIG. 2. The gain A is substantially proportional to a feedback resistor Rf, wherein:

$$A \approx gm \cdot Rf,$$

Figure 3:
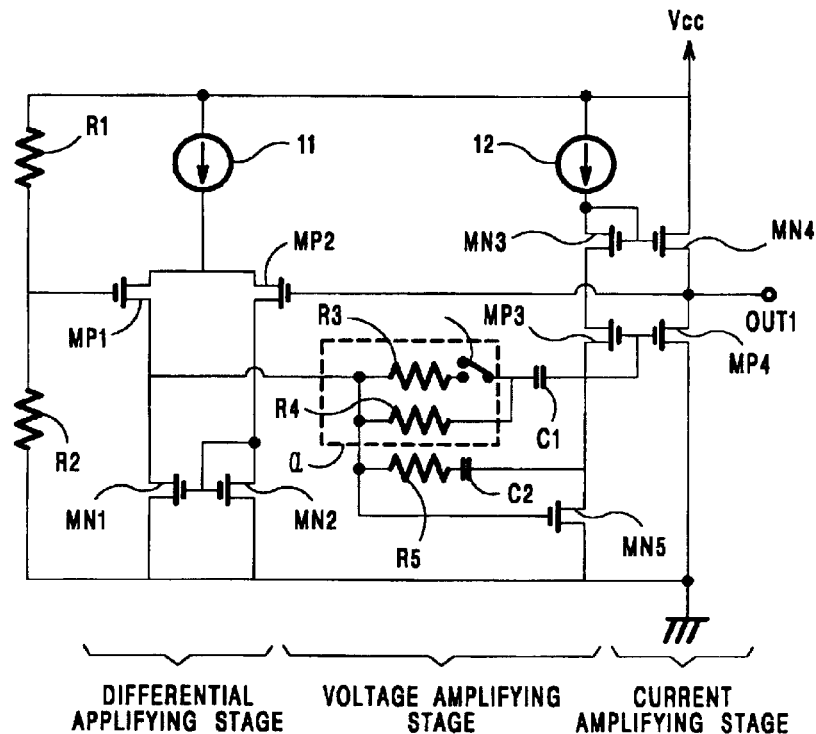
FIG. 3 is a circuit diagram of a variable-impedance reference circuit according to the present invention.
Figure 4:
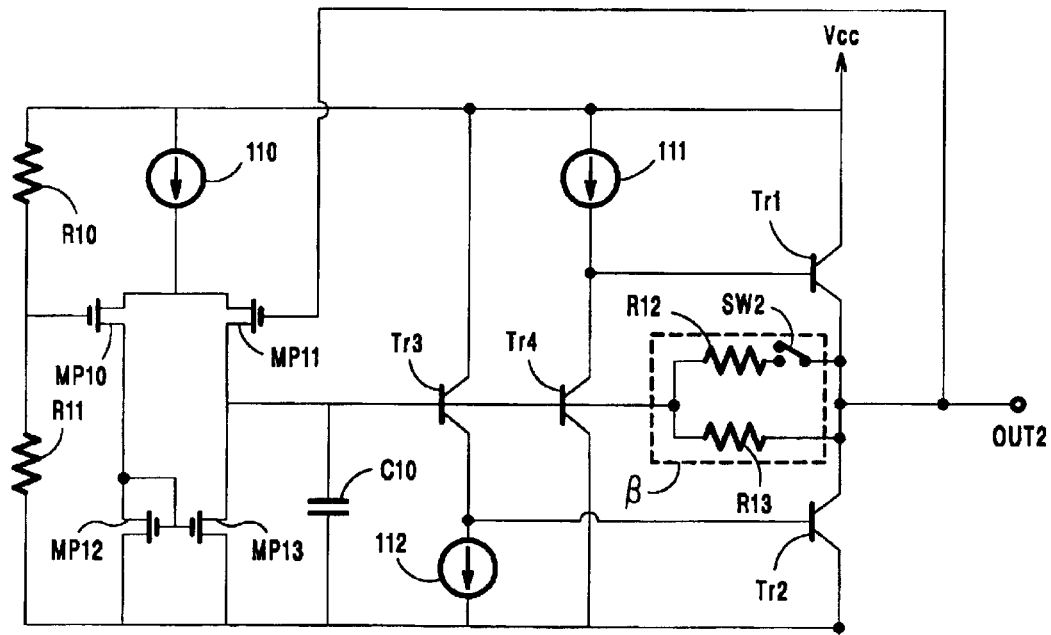
FIG. 4 is a circuit diagram of a variable-impedance reference circuit according to a second embodiment.

A mutual conductance is gm, as best shown in FIGS. 3 and 4, described below in detail. The gain A is in proportion to the feedback resistor Rf. That is, the relationship between the gain A and the feedback resistor Rf is substantially inversely proportional. Thus, the output impedance Zo and the gain A are in substantially inverse proportion to each other, and the gain A is proportional to the feedback resistor Rf.

A circuit diagram of a variable-impedance reference circuit according to the present invention is best shown in FIG. 3. A source electrode of an N-channel field-effect transistor MN1 is grounded. A drain electrode of the N-channel field-effect transistor MN1 is connected to a drain electrode of a P-channel field-effect transistor MP1. A gate electrode of the P-channel field-effect transistor MP1 is connected to a power supply Vcc via a resistor element R1, and further is grounded via a resistor element R2. A voltage divided by the resistor elements R1 and R2 is applied thereto. The P-channel field-effect transistor MP1 and the N-channel field-effect transistor MN1 constitute a first serial connection circuit A source electrode of the P-channel field-effect transistor MP1 is connected to a source electrode of a P-channel field-effect transistor MP2. A drain electrode of the P-channel field-effect transistor MP2 is connected to a drain electrode of an N-channel field-effect transistor MN2. A gate electrode of the N-channel field-effect transistor MN2 is connected to a gate electrode of the N-channel field-effect transistor MN1, and further is connected to the drain electrode of the N-channel field-effect transistor MN2. A source electrode of the N-channel field-effect transistor MN2 is grounded. The P-channel field-effect transistor MP2 and the N-channel field-effect transistor MN2 constitute a second serial connection circuit. The first and second serial connection circuits are connected to the power supply Vcc via a constant current supply 11, so as to constitute a differential amplifying circuit. The N-channel field-effect transistors MN1 and MN2 constitute a current mirror circuit.

Next, a source electrode of an N-channel field-effect transistor MN3 is connected to a source electrode of a P-channel field-effect transistor MP3. A drain electrode of the P-channel field-effect transistor MP3 is connected to a drain electrode of an N-channel field-effect transistor MN5. A gate electrode of the N-channel field-effect transistor MN5 is connected to the drain electrodes of the P-channel field-effect transistor MP1 and the N-channel field-effect transistor MN1. A source electrode of the N-channel field-effect transistor MN5 is grounded. A drain electrode of an N-channel field-effect transistor MN4 is connected to the power supply Vcc and a gate electrode thereof is connected to a gate electrode and a drain electrode of the N-channel field-effect transistor MN3. A source electrode of an N-channel field-effect transistor MN4 is connected to a source electrode of a P-channel field-effect transistor MP4 and a reference output terminal OUT1, and further is connected to a gate electrode of the P-channel field-effect transistor MP2. A gate electrode of the P-channel field-effect transistor MP4 is connected to a gate electrode and the drain electrode of the P-channel field-effect transistor MP3 and a drain electrode of the P-channel field-effect transistor MP4 is grounded. The N-channel field-effect transistor MN3, the P-channel field-effect transistor MP3, and the N-channel field-effect transistor MN5 constitute a third serial connection circuit. The third serial connection circuit is connected to the power supply Voc via a constant current supply 12, so as to pass a constant electric current. The N-channel field-effect transistor MN4 and the P-channel field-effect transistor MP4 constitute a fourth serial connection circuit Wherein the N-channel field-effect transistor MN3 and the P-channel field-effect transistor MP3 constitute a bias circuit of a voltage amplifying stage.

Furthermore, between the gate electrode and the drain electrode of the N-channel field-effect transistor MN5, there is a resistor element R3 that is turned on and off by a switch SW1, a resistor element R4 connected in parallel with the resistor element R3, and a capacitor C1 connected in series with these resistor elements, which are connected to each other. Between the gate electrode and the drain electrode of the N-channel field-effect transistor MN5, a resistor element R5 and a capacitor C2 are connected as a phase compensation circuit. However, they are minimally involved in output impedance characteristics.

The operation of the reference circuit of FIG. 3 will now be explained. In the initial state of the reference circuit:

1) To the reference output terminal OUT1 connected to the source electrode of the P-channel field-effect transistor MP4, 0 V is initially applied. 0 V are applied to the gate of the P-channel field-effect transistor MP2 while a voltage of Vcc/2, which is obtained by dividing Vcc with the resistor element R1 and the resistor element R2, is applied to the gate of the P-channel field-effect transistor MP1.

2) Thereby, the P-channel field-effect transistor MP1 is turned off and the P-channel field-effect transistor MP2 is turned on, so that an electric current of 1i flows to the source of the P-channel field-effect transistor M2.

3) At this time, the same 1i drain current flows in the P-channel field-effect transistor M2. An electric current of 1i flows into the drain of the N-channel field-effect transistor MN2. The N-channel field-effect transistor MN2 constitutes the current mirror circuit with the N-channel field-effect transistor MN1, and thus the same drain current also flows in the MN1.

4) With the drain current difference between the N-channel field-effect transistor MN1 and the P-channel field-effect transistor MP1 (i.e., an electric current of 1i), the capacitor C1 is charged. Then, the gate voltage of the N-channel field-effect transistor MN5 decreases simultaneously to a nearly turned-off state. The capacitor C2 and the resistor element R5 are for phase compensation. The capacitance of the capacitor C2 is much smaller than that of the capacitor C1, and the circuit current is negligible.

5) The drain voltage of the N-channel field-effect transistor MN5 increases at the rate of the charging speed of the capacitor C1, resulting in the voltage increase of the reference output terminal OUT1 substantially along with the increase of the drain voltage.

Then, the reference circuit reaches an equilibrium state as follows:

1) When the voltage of the reference output terminal OUT1 reaches Vcc/2, the P-channel field-effect transistor MP1 is balanced with the P-channel field-effect transistor MP2, so that an electric current of ½i flows in both the transistors.

2) At this time, the same electric current of ½i as the drain current of the P-channel field-effect transistor MP2 flows in the drain electrodes of the N-channel field-effect transistors MN2 and MN1.

3) Then, since the drain current difference between the N-channel field-effect transistor MN1 and the P-channel field-effect transistor MP1 becomes zero, so that the capacitor 1 is not charged or discharged and the drain voltage of the N-channel field-effect transistor MN5 becomes constant, maintaining the reference output terminal OUT1 in an equilibrium state at a voltage of Vcc/2.

The reference output terminal OUT1 with the excessive output voltage will be described as follows:

1) If the size is expressed with an absolute value ignoring the current direction, when the voltage of the reference output terminal OUT1 becomes larger than Vcc/2, the drain current of the P-channel field-effect transistor MP1 increases, and becomes larger than that of the P-channel field-effect transistor MP2. It becomes larger than the drain current of the N-channel field-effect transistors MN1 and MN2.

2) The drain current difference between the N-channel field-effect transistor MN1 and the P-channel field-effect transistor MP1 increases the gate voltage of the N-channel field-effect transistor MN5 at the same time the capacitor C1 is discharged, thereby increasing the drain current of this N-channel field-effect transistor MN5.

3) The drain voltage of the N-channel field-effect transistor MN5 decreases at the rate of the discharging speed of the capacitor C1 and thereby, the reference output terminal OUT1 decreases in voltage substantially along with this drain voltage decrease so as to be balanced at the time of reaching Vcc/2.

The parallel connection of the resistor element R4 with the series connection of the resistor element R3 and the switch SW1 shown in a loop gain adjusting circuit α is equivalent of the feedback resistor Rf mentioned above. Also, the circuit, except the resistor elements R3, R4, and R5 and the capacitors C1 and C2, is the equivalent of an amplifying circuit 11 in FIG. 2.

Changes in ohmic value due to the switching operation of the switch SW1 in the loop gain adjusting circuit α will be described. By turning on the switch SW1, the resistor elements R3 and R4 are connected together in parallel. A combined ohmic value $R_{total}$ is expressed as follows:

$$R_{total} = r3 \cdot r4/(r3+r4),$$

wherein ohmic values of the resistor elements R3 and R4 are r3 and r4, respectively. Therefore, the relationship between $R_{total}$ and r4 may be expressed as follows:

$$R_{total} < r4,$$

so that the combined ohmic value decreases. That is, the value equivalent of the feedback resistor Rf mentioned above decreases, so that the output impedance increases. Thus, the relationship between the output impedance and the feedback resistor is substantially inversely proportional. First and second series connection circuits constitute a differential amplifying stage having a differential amplifying function. The resistor elements R3, R4, and R5, the capacitors C1 and C2, and a third series connection circuit form a voltage amplifying stage. A fourth series connection circuit is a current amplifying stage for amplifying a current.

A circuit diagram of a variable-impedance reference circuit according to a second embodiment is best shown in FIG. 4. A source electrode of an N-channel field-effect transistor MN12 is grounded. A drain electrode of the N-channel field-effect transistor MN12 is connected to a drain electrode of a P-channel field-effect transistor MP10. A gate electrode of the P-channel field-effect transistor MP10 is connected to the power supply Vcc via a resistor element R10, and further is grounded via a resistor element R11, so that a voltage divided by the resistor elements R10 and R11 is applied thereto. The P-channel field-effect transistor MP10 and the N-channel field-effect transistor MN12 constitute a first serial connection circuit. A source electrode of the P-channel field-effect transistor MP10 is connected to a source electrode of a P-channel field-effect transistor MP11. A drain electrode of the P-channel field-effect transistor MP11 is connected to a drain electrode of an N-channel field-effect transistor MN13. A gate electrode of the N-channel field-effect transistor MN13 is connected to a gate electrode of the N-channel field-effect transistor MN12, and further is connected to the drain electrode of the N-channel field-effect transistor MN12. A source electrode of the N-channel field-effect transistor MN13 is grounded. The P-channel field-effect transistor MP11 and the N-channel field-effect transistor MN13 constitute a second serial connection circuit. The first and second serial connection circuits are connected to a constant current supply 110 so as to constitute a differential amplifying circuit.

A drain electrode of the P-channel field-effect transistor MP11 is connected to a capacitor C10 so as to adjust response characteristics of an amplifying circuit. Further, the drain electrode of the P-channel field-effect transistor MP11 is connected to the bases of an NPN transistor Tr3 and a PNP transistor Tr4. The collector of the NPN transistor Tr3 is connected to the power supply Vcc while the emitter thereof is grounded via a constant current supply 112. The emitter of the NPN transistor Tr3 is connected to the base of a PNP transistor Tr2 so as to drive the PNP transistor Tr2. The emitter of the PNP transistor Tr4 is connected to a constant current supply 111 which is connected to the power supply Vcc via the constant current supply 111, and the collector of the PNP transistor Tr4 is grounded. The emitter of the PNP transistor Tr4 is connected to the base of an NPN transistor Tr1 so as to drive the NPN transistor Tr1. The collector of the NPN transistor Tr1 is connected to the power supply Vcc while the emitter thereof is connected to a reference output terminal OUT2 and the emitter of the PNP transistor Tr2. The collector of the PNP transistor Tr2 is grounded The NPN transistor Tr1 and the PNP transistor Tr2 constitute a complementary SEPP (single ended push-pull) circuit, so that the combined output is fed to the reference output terminal OUT2.

The output from the drain electrode of the P-channel field-effect transistor MP11 is input to the bases of the NPN transistor Tr3 and the PNP transistor Tr4 so as to be connected to a loop gain adjusting circuit β at the same time of emitter follower. The parallel connection of a resistor element R13 with the series connection of a resistor element R12 and a switch SW2, which are shown in the loop gain adjusting circuit β, is the equivalent of the feedback resistor Rf mentioned above. By turning off the switch SW2, as described above, the ohmic value shown in the loop gain adjusting circuit β decreases, so that the gain is decreased to increase the output impedance.

As described above, an open loop gain is decreased so as to increase the impedance of the reference output by turning on the switch SW1 shown in FIG. 3 (or the switch SW2 shown in FIG. 4), and is increased so as to decrease the impedance by turning off the switch SW1 shown in FIG. 3 (or the switch SW2 shown in FIG. 4).

Figure 5:
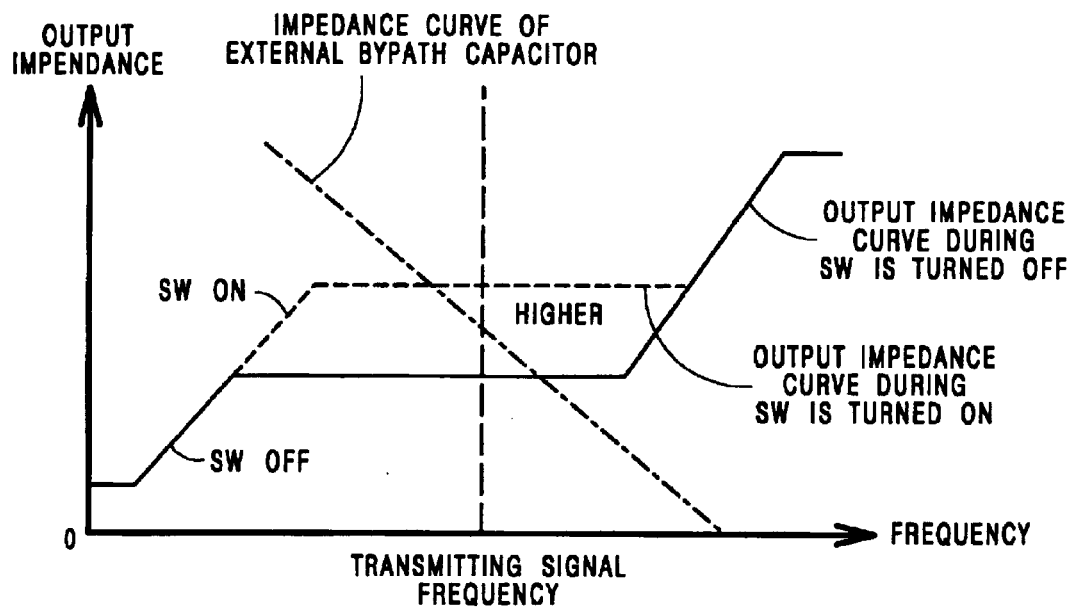
FIG. 5 is a graph showing changes in output impedance of a reference circuit according to the present invention with respect to transmitting signal frequency.

As best shown in FIG. 5, a graph shows the changes in output impedance by opening and closing a switch of the reference circuit according to the present invention using the digitizer frequency to enter the horizontal axis, and the output impedance to enter the vertical axis. Since the output impedance of the reference circuit may be switched by turning the switch SW off when a receiver receives a signal from a sensor coil, the output impedance of the reference circuit is decreased for reducing noise. By turning the switch SW on when a high-frequency signal transmitter transmits a signal to the sensor coil, the output impedance of the reference circuit is increased for preventing the charge of a bypath capacitor from being absorbed. The discharge loss is decreased in the transmitting signal frequency of the digitizer, since the output impedance is higher than the impedance of an external bypath capacitor. Therefore, the noise is reduced when receiving a signal from the sensor coil, and the current loss reduced when transmitting a signal to the sensor coil.

In addition, a method is provided for switching the magnitude of the output impedance of the reference circuit by switching the gain due using a switch, wherein the variable-impedance reference circuit assembled in the digitizer comprises a loop gain adjusting circuit having a switch. However, other methods for switching the magnitude of the output impedance may be used.

Figure 6:
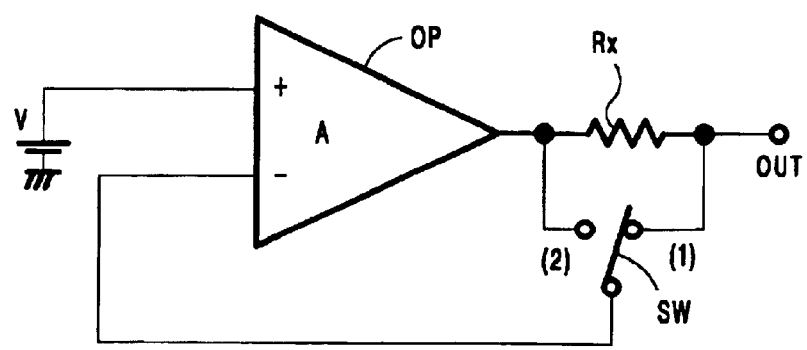
FIG. 6 is a circuit diagram of a variable-impedance reference circuit according to a third embodiment.

A circuit for switching the magnitude of the output impedance according to a third embodiment is best shown in FIG. 6. The output impedance Zo of the reference circuit when the switch SW is turned to (1) is expressed as follows:

$$Zo=(Ro+Rx)/(A+1),$$

wherein the output impedance of a differential amplifier OP is Ro, and the output resistance is Rx, so that the output impedance Zo is relatively small.

When the switch SW is turned to (2), the output impedance Zo is expressed as:

$$Zo=Rx+Ro/(A+1),$$

so that the output impedance Zo becomes comparatively larger. Accordingly, by switching the switch SW, the output impedance Zo can be switched.

It will become apparent to one of ordinary skill in the art that various modifications and variations can be made in construction or configuration of the present invention without departing from the scope or spirit of the invention. For example, the transistor in the circuit may be a bipolar transistor or a field effect transistor (FET). Thus, it is intended that the present invention cover such modifications and variations of the invention, provided they come within the scope of the following claims and their equivalents.

What is claimed is:

1. A variable-impedance reference circuit comprising a reference circuit for supplying a reference electric potential to a sensor coil, wherein the variable-impedance reference circuit switches an output impedance of the reference circuit so that the output impedance is large during transmitting a high-frequency signal to the sensor coil and the output impedance is small during receiving a response signal from the sensor coil.

2. The circuit of claim 1, wherein the reference circuit further comprises a loop gain adjusting circuit having a switch for switching a gain, so as to switch the magnitude of the output impedance of the reference circuit by opening and closing the switch to switch the gain.

3. The circuit of claim 1, further comprising an N-channel metal-oxide semiconductor field-effect transistor and a P-channel metal-oxide semiconductor field-effect transistor.

4. The circuit of claim 1, further comprising a transistor.

5. The circuit of claim 4, wherein said transistor is selected from the group consisting of a bipolar transistor and a field effect transistor.

6. The circuit of claim 1, wherein said reference circuit is a monoploid voltage-follower type reference circuit.

7. The circuit of claim 1, wherein the variable-impedance reference circuit includes a differential amplifying stage, a voltage amplifying stage, and a current amplifying stage.

8. The circuit of claim 7, wherein said differential amplifying stage comprises a first serial connection circuit, a second serial connection circuit, and a current supply.

9. The circuit of claim 7, wherein said voltage amplifying stage comprises a plurality of resistors, at least two capacitors, and a third serial connection circuit.

10. The circuit of claim 7, wherein said current amplifying stage comprises a fourth serial connection circuit.

11. A method for varying an output impedance of a reference circuit for supplying a reference electric potential to a sensor coil, the method comprising the steps of:

increasing the output impedance of the reference circuit during transmitting a high-frequency signal to the sensor coil; and reducing the output impedance of the reference circuit during receiving a response signal from the sensor coil, wherein current consumption is thereby reduced.

12. The method of claim 11, comprising the further step of switching a switch to increase the output impedance.

* * * * *